United States Patent [19]

Sevenhans et al.

[11] Patent Number: 5,440,264
[45] Date of Patent: Aug. 8, 1995

[54] FREQUENCY TUNING SYSTEM FOR TUNING A CENTER FREQUENCY OF AN ANALOG BANDPASS FILTER

[75] Inventors: Joannes M. J. Sevenhans, Brasschaat; Mark G. S. J. Van Paemel, Zoersel, both of Belgium

[73] Assignee: Alcatel N.V., Amsterdam, Netherlands

[21] Appl. No.: 350,705

[22] Filed: Dec. 7, 1994

Related U.S. Application Data

[63] Continuation of Ser. No. 96,613, Jul. 23, 1993, abandoned.

[30] Foreign Application Priority Data

Jul. 24, 1992 [EP]  European Pat. Off. ............ 92202293

[51] Int. Cl.⁶ ............................................... H03B 5/00
[52] U.S. Cl. .................................... 327/553; 327/552; 330/305
[58] Field of Search ............... 330/300, 254, 109, 102, 330/301, 305, 306; 302/520, 521, 494; 328/162; 327/551, 552, 553, 554, 555, 556, 557, 558, 559; 333/17.1, 174

[56] References Cited

U.S. PATENT DOCUMENTS

| | | | |
|---|---|---|---|
| 3,528,040 | 9/1920 | Galvin | 330/109 |
| 4,340,868 | 7/1982 | Pace | 330/109 |
| 4,691,171 | 9/1987 | Van Roermund et al. | 328/162 |
| 5,028,884 | 7/1991 | Kondo et al. | 330/102 |
| 5,117,205 | 5/1992 | Nauta | 331/117 FE |
| 5,124,593 | 7/1992 | Michel | 328/162 |
| 5,227,681 | 7/1993 | Koyama et al. | 302/521 |

OTHER PUBLICATIONS

"A 10.7 MHz CMOS OTA-R-C Bandpass Filter with 68 dB Dynamic Range and on-Chip Automatic Tuning", M. Steyaert et al, *ISSCC*, Feb. 1992, pp. 66-67.
"A CMOS Transconductance-C Filter Technique for Very High Frequencies", B. Nauta, *IEEE Journal of Solid-State Circuits* Feb. 27, 1992, No. 2, New York, pp. 142-153.
"An Elliptic Continuous-Time CMOS Filter with On-Chip Automatic Tuning", M. Banu, *IEEE Journal of Solid-State Circuits*, vol. SC-20, No. 6, Dec. 1985, pp. 1114-1121.
"Integrated Filters for TV Applications", M. Rieger et al, *IEEE 1990 International Conference on Consumer Electronics*, Jun. 6-8, 1990, Rosemont Ill., pp. 144-145.
"A Very Linear BiCMOS Transconductor for High-Frequency Filtering Applications", R. Castello et al, *IEEE International Symposium on Circuits and Systems*, vol. 2, May 1-3, 1990 New Orleans La., pp. 1365-1367.
"Simulating General Parameter LC-Ladder Filters for Monolithic Realizations with Only Transconductance Elements and Grounded Capacitors", M. Tan et al, *IEEE Trans on Circuits & Systems 36* Feb. 1989, No. 2, New York, pp. 299-307.

*Primary Examiner*—Timothy P. Callahan
*Assistant Examiner*—Dinh Le
*Attorney, Agent, or Firm*—Ware, Fressola, Van Der Sluys & Adolphson

[57] ABSTRACT

Based on the insight that the voltage-to-current ratio or gain of a capacitor (Z) at a particular reference frequency is the product of its capacitance value with said reference frequency, a tuning system is disclosed which tunes the center frequency of an analog bandpass filter by tuning the characteristic integrator frequency (fc) of an OTA-C integrator by making the transconductance of the operational transconductance amplifier (OTA) thereof equal to the aforementioned gain at that characteristic frequency. Therefore, the tuning system includes a first tuning path in which the OTA, (or a replica thereof) is included and a second tuning path including another amplifier (B-OTA) "degenerated" by the capacitor (Z) so as to produce the required gain. The gains of both these tuning paths are then equalized by matching means (MM) generating a frequency tuning signal (VTF) which is applied to both OTA and OTA-C.

8 Claims, 3 Drawing Sheets

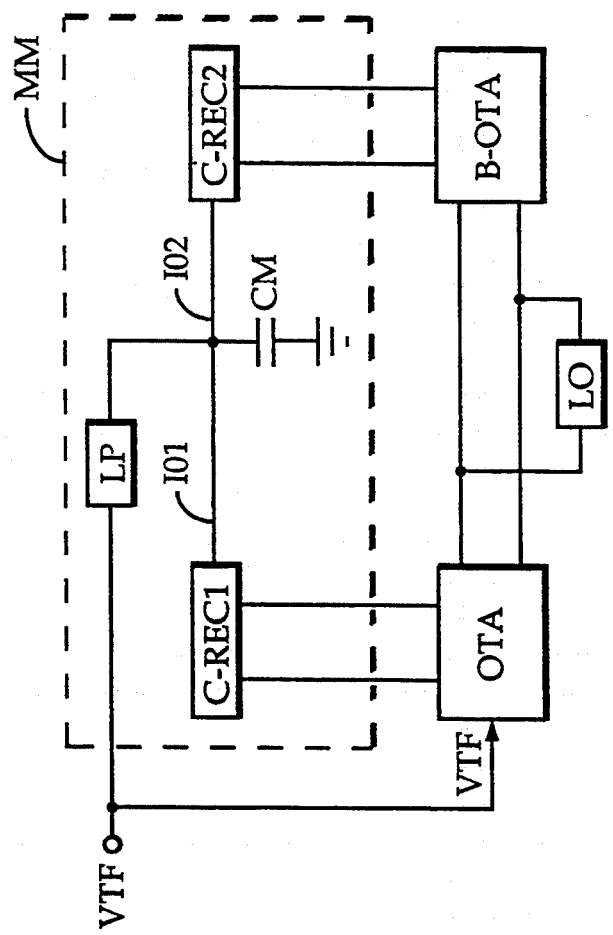
FIG. 3
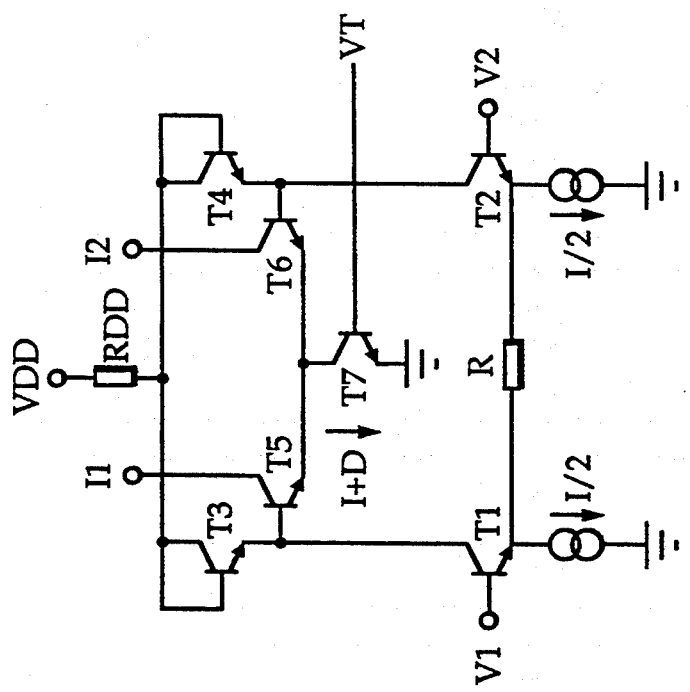
OTA  FIG. 2 with 68 dB dynamic range and on-chip automatic tuning", ISSCC February 1992, 66–67, by M. Steyaert and J. Silva-Martinez.

FREQUENCY TUNING SYSTEM FOR TUNING A CENTER FREQUENCY OF AN ANALOG BANDPASS FILTER

This is a continuation of copending application Ser. No. 08/096,613 filed on Jul. 23, 1993, now abandoned.

CROSS-REFERENCE TO RELATED APPLICATION

This application discloses subject matter which may be disclosed and claimed in copending, co-owned patent application U.S. Ser. No. 08/076,517 filed on even date herewith entitled "Quality Factor Tuning System and Current Rectifier Used Therein".

TECHNICAL FIELD

The present invention relates to a tuning system for generating a tuning signal which tunes a center frequency of an analog bandpass filter by tuning the transconductance of an operational transconductance amplifier (OTA) to a desired transconductance value, said tuning system including a reference capacitor so chosen that the ratio of said desired transconductance value on the capacitance value of said capacitor is substantially proportional to a chosen reference frequency of said amplifier.

BACKGROUND OF THE INVENTION

Such a tuning system is already known from the paper "A 10.7 MHz CMOS OTA-R-C bandpass filter with 68 dB dynamic range and on-chip automatic tuning", ISSCC February 1992, 66–67, by M. Steyaert and J. Silva-Martinez. This paper more particularly concerns filters built with operational transconductance amplifiers (OTA's) and associated capacitors C which are commonly known as "OTA-C" filters. The use of this type of filter has proven to be particularly advantageous in the domain of integrated circuit analog filters. One of the advantages of such filters is derived from the controllability of the transconductances of the OTA's incorporated therein. Indeed, by tuning these transconductances the frequency response of the filter can be tuned. This tuning is primarily used to provide a very accurate frequency response in spite of inevitable implementation inaccuracies.

The present invention more particularly relates to a tuning system controlling such an OTA-C filter.

Such tuning systems commonly operate according to the master-slave principle wherein at least one master filter included in a data processing path is tuned by a tuning signal, e.g. a tuning voltage tuning a transconductance as mentioned above, generated by the tuning system which includes a replica of at least a section of this master filter. This replica is called a slave filter and corresponds to the above mentioned tunable filter. The tuning signal has to be so generated that the frequency reponse of the slave filter matches a desired response.

In the aforementioned Steyaent et al document it is proposed to determine this frequency response by tuning separately the quality factor of the total filter and the time constant of the OTA-C integrators included in the filter. The latter tuning which is equivalent to a frequency tuning is more particularly described under the article's sub-heading "Automatic tuning of the frequency" and is the subject of the present invention. For the tuning of the quality factor reference is made to the above-mentioned co-pending patent application of the same inventors as the present one, filed on even date and entitled "Quality factor tuning system and current rectifier used therein" under U.S. Serial Number (Atty. Docket 902-151).

For the frequency tuning it is proposed in the known Steyaent et al document to include a replica of the above mentioned OTA-C integrators of the master filter in the tuning system. The replica of the OTA is then the above mentioned amplifier whereas the replica of C is the mentioned reference capacitor which are used to generate the tuning signal which is also applied to the corresponding integrators in the master filter. The tuning signal is so adjusted that a predetermined ratio exists between the transconductance of the amplifier and the capacitance value of the reference capacitor. In the referenced Steyaent et al document it is further proposed to use a tuning system built according to the well known switched capacitor technique. The latter technique however leads to a rather complicated tuning system as can be verified from the above Steyaent et al paper. Indeed, not only does the proposed tuning system require a relatively large amount of hardware, but the derivation of non-overlapping clocks needed for performing the switched capacitor technique moreover makes it difficult to design this system and increases the hardware cost. Futhermore, the above technique is not suitable when the above-mentioned reference frequency used in the tuning system is relatively high. Indeed, in that case the switching involved adversely affects the performance of the tuning system. Such a high reference frequency may however be necessary to provide a good tuning in case the filter is a high frequency bandpass filter as the tuning will then take into proper account the frequency dependent parasitics inevitably present in such OTA's.

DISCLOSURE OF INVENTION

An object of the present invention is to provide a tuning system of the above known type but which is simpler to design and requires less hardware, while allowing the use of an high reference frequency.

This object is achieved due to the fact that said tuning system includes first and second tuning paths as well as matching means, said first tuning path including said amplifier of which the output signal is indicative of said transconductance to be tuned, said second tuning path including said capacitor and producing a reference signal indicative of the voltage-to-current ratio of said capacitor at said reference frequency, and that said matching means compares said output signal and said reference signal and accordingly generates said tuning signal.

The invention uses the known fact that the voltage-to-current ratio of a capacitor at the reference frequency equals the product of its capacitance value with this reference frequency. Therefore the transconductance which is nothing else than the voltage-to-current ratio or gain of the OTA is verifiably tuned to the desired value providing the two aforementioned voltage-to-current ratios match. As will be described later, the matching means can be designed in a simple way and requires relatively little hardware. Moreover, such a tuning system may be so designed that only analog signals are present in it so that the above restriction to a relatively low reference frequency can be eliminated.

It is to be noted that the above tuning system is not restricted to the tuning of the frequency of an OTA-C integrator included in a filter. By choosing a suitable capacitance value for the reference capacitor and a suitable reference frequency, a tuning signal tuning the transconductance of any OTA to a desired value can be generated by this tuning system. This property will be further used in an inventive way as described below. It allows, more particularly, that the amplifier and the reference capacitor in the tuning system may be different from exact replicas of the OTA and its associated capacitor included in the integrator of the master filter which is to be tuned.

Another characteristic feature of the present invention is that said tuning system also includes a signal generator means for generating a reference input signal having said reference frequency, said input signal being applied to both said first and said second tuning paths.

By applying this input signal at the reference frequency to both tuning paths, the matching means can be kept very simple as it only has to compare the amplitude of the output signal with that of the reference signal, for example, with a proportionality factor. Indeed, any relative difference between these amplitudes is proportional to a difference in the above voltage-to-current ratios.

Another important aspect of the present invention is that said second tuning path includes a second operational transconductance amplifier whose transconductance is determined by said reference capacitor included therein as a degeneration impedance, and that said voltage-to-current ratio is the transconductance of said second amplifier, the value of the last mentioned transconductance being substantially proportional to the product of said capacitance value with said reference frequency.

By realizing the voltage-to-current ratio relative to the reference capacitor in this simple way it can be easily measured as the differential output current of the second operational transconductance amplifier. Moreover, in so doing both the output and reference signals are differential output currents appearing on respective differential terminals. This simplifies the design of the matching means as both tuning paths end in a same way. Similar building blocks for the two paths may then be used and this simplifies the design effort especially when integrated circuit technology is used.

To be noted that the capacitance value of the reference capacitor and the reference frequency will have to be so chosen that the transconductance of the second OTA is effectively given by the above mentioned product. This requires that this product be small enough to neglect the transconductances of the input transistors included in the second OTA.

Still another characteristic feature of the present invention is that said first and second tuning paths perform a voltage-to-current conversion, that the output currents of said tuning paths are further converted to first and second single ended and rectified currents by respective first and second current rectifiers included in said matching means and that said rectified currents charge and discharge a matching capacitor also included in said matching means, the one of the tuning paths charging said matching capacitor being so determined that the voltage over said capacitor can be used for determining said tuning signal.

It can be verified that with such very simple circuitry the voltage over the matching capacitor is a measure of the differences in the voltage-to-current ratios of the first and second tuning paths. The tuning path corresponding to the charging rectified current can be so chosen that the latter voltage over the capacitor already constitutes the required negative feedback tuning signal.

Since in the first tuning path the voltage-to-current ratio is in principle achieved without any phase shift whereas in the second tuning path the reference capacitor always gives rise to a phase shift of approximately 90 degrees, the voltage of the matching capacitor will always have a verifiably large ripple. However, due to the current rectification, this unavoidable ripple voltage will have a much larger signal frequency than the above mentioned reference frequency and will therefore be located outside the passband frequency range. Leakage of this ripple to the master filter or to the first amplifier will thus in practical circumstances not disturb the frequency response thereof. However, to be on the safe side, it is possible to low pass filter the tuning signal with a non-critical low pass filter. Such a low pass filter is in fact already achieved as a parasitic effect by the signal transmission lines in integrated circuits.

Also an important feature of the present invention is that the first mentioned operational transconductance amplifier includes an input and an output stage, said input stage consisting of a first differential amplifier arrangement and the input terminals of said first arrangement being the input terminals of said first amplifier, that the transconductance characteristic of said first arrangement is linearized by a degeneration resistor, the output terminals of said first arrangement being connected to respective input terminals of said output stage which consists of a second differential amplifier arrangement including a current source connected to a common junction point of two amplifier branches, said current source being controlled by said tuning signal and that the output terminals of said scond arrangement are the output terminals of said first operational transconductance amplifier.

Such an inventive OTA is particularly advantageous as it present a transconductance characteristic with an excellent linearity, this linearity being unaffected by the tuning of the OTA. Indeed, the input stage is very linear due to the well known degeneration technique for differential amplifier arrangements, while this linearity is in a first approximation not adversely affected by the output stage which further amplifies the signal with a factor proportional to the current produced by the controllable current source.

This OTA furthermore enables the tuning system to also be used to tune the transconductances of OTA's included in a data processing path and which are not identical to that of the OTA included in the tuning system. Indeed, if these OTA's are of the above type their transconductance is inversely proportional to the resistance value of their degeneration resistor. If they are furthermore tuned by the same tuning signal this proportionality will verifiably also be achieved between the various OTA's as the ratio of the resistance values of the corresponding degeneration resistors. Such a resistance ratio can be obtained with high precision on an electronic chip and the latter feature is hence also very advantageous in the design of such electronic chips.

More particularly, by using OTA's of the above type, the OTA of the tuning system may differ from the OTA's in the data processing path by using a different degeneration resistor as long as the reference frequency and the capacitance value of the reference capacitor are accordingly determined as will be clarified below. The latter advantage may be used either to choose the parameters of the tuning system, i.e. the reference capacitor and the reference frequency, so as to achieve better performance, or to share the tuning system between different OTA's in the data processing path where the above resistance ratios are predetermined so as to achieve desired transconductances based on a same tuning signal.

Further features of this operational transconductance amplifier are that said first arrangement also includes two amplifier branches each including an input transistor coupled between said degeneration resistor and a respective one of a first and a second diode, the junction points of each of said input transistors with a respective one of said diodes constituting said output terminals of said first arrangement, and the last mentioned amplifier branches being fed by at least one constant current source, that each of the first mentioned amplifier branches includes an input transistor connected between said common junction point and to a respective one of said output terminals of said second arrangement, and that said diodes are constituted by diode-connected transistors.

The use of a constant current source in the input stage keeps the voltage-to-current ratio of this input stage fixed and linear, while the use of diodes minimizes the distortion when the output signal of the input stage is passed on to the output stage.

Further inventive aspects of the present invention are that said voltage of said matching capacitor is applied to a low pass filter whose output signal is said tuning signal which is then applied to said first amplifier and to at least one third operational transconductance amplifier having similar operational characteristics as said first operational transconductance amplifier, that said third operational transconductance amplifier is included in a filter wherein it is associated to a third capacitor forming together with said third amplifier an integrator, that the transconductance of said third amplifier is proportional to the transconductance of the first mentioned amplifier, and that the product of the characteristic frequency of said integrator with the capacitance value of said third capacitor is substantially proportional to the product of said capacitance value of said reference capacitor with said reference frequency, the proportionality factors of the two proportionalities being substantially equal.

The above aspects which will be proved below show the wide application range of the present invention and the freedom with which the aforementioned parameters can be chosen to achieve optimal performances. Moreover, it can be verified from the above that by carefully choosing these parameters and the type of the OTA used in the tuning system a single tuning system can be shared between different OTA's included in the data processing path as already mentioned.

Also another feature of the present invention is that said filter is a bandpass filter, that said reference frequency equals the center frequency of the bandpass frequency range of said filter, said signal generator means being used for tuning both a quality factor of said filter and the transconductance of at least one third amplifier included in said filter.

By choosing the reference frequency in this way, the above mentioned frequency dependent parasitics will be optimally cancelled in the tuning system as the first mentioned OTA amplifier is tuned in the frequency range of interest for the filter or third amplifier, i.e. in the passband frequency range of the filter. Moreover, as can be verified from the above mentioned co-pending patent application, it allows the signal generator means to be shared between the two tuning systems, i.e. the quality factor tuning system and the present frequency tuning system.

These and other objects, features and advantages of the present invention will become more apparent in light of the detailed description of a best mode embodiment thereof, as illustrated in the accompanying drawing.

BRIEF DESCRIPTION OF THE DRAWING

FIG. 2 shows an operational transconductance amplifier OTA which is used in the blocks OTA1-5 of the filter BIQUAD shown in FIG. 1;

FIG. 3 represents a tuning system in accordance with the present invention for tuning the transconductance of any of the blocks OTA1, OTA3 and OTA5 of FIG. 1.

BEST MODE FOR CARRYING OUT THE INVENTION

Figure 1:
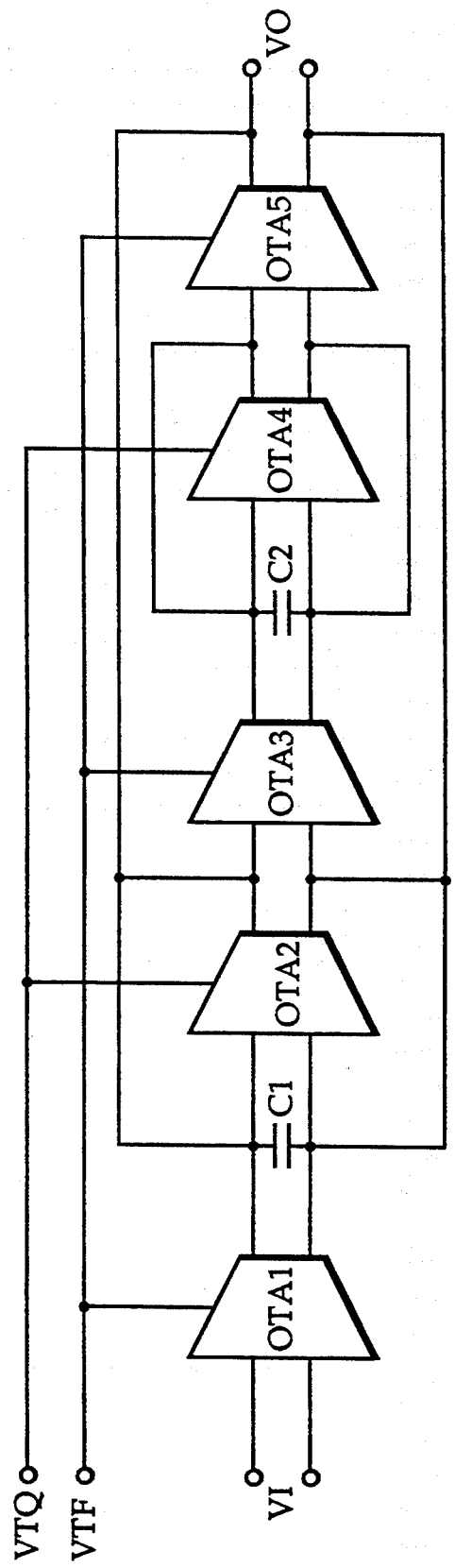
FIG. 1 shows a biquadratic filter BIQUAD adapted to be tuned with a tuning system according to the present invention.

The tunable biquadratic filter BIQUAD shown in FIG. 1 is an analog continuous time filter implemented by amplifier-capacitor pairs each including an operational transconductance amplifier, henceforth generally indicated by the prefix OTA, and a capacitor, henceforth generally referenced with the prefix C. Such OTA-C pairs form the basic building block of the well known OTA-C filter topology and these pairs are nothing else than classical basic integrators. OTA-C filters are recognized for their advantageous properties and therefore widely used in analog on-chip filtering, e.g. in the mobile communications field. A particular advantage of this type of filter is that it can be easily tuned by tuning the transconductances of the OTA's included therein. This tuning is critical for achieving satisfactory performance in spite of implementation inaccuracies.

In the above mentioned paper it is disclosed that the frequency response of such an OTA-C filter can be tuned to a desired response by two separate tuning systems. A first tuning system generates a frequency tuning signal for the transconductances of the OTA's included in the aforementioned integrators.

Such a frequency for tuning system tuning the transconductance of the OTA's included in the integrators so as to achieve a desired characteristic integrator frequency as will be described below is the subject of the present invention. A second tuning system generates another tuning signal used for tuning the quality factor of the filter to a desired value. A particular quality factor tuning system is the subject of the above mentioned co-pending patent application filed on even date, from the same inventors and entitled "Quality factor tuning system and current rectifier used therein".

Such tuning systems commonly operate according to the master-slave principle. This means that the above mentioned tuning signals are applied to at least one filter included in a data path for processing information data and called "master" filter, while the tuning system itself includes a replica of at least a part of this master filter, which replica is called "slave" filter. The slave filter is then used by the tuning system as reference for producing the tuning signal. In the presently described frequency tuning system the master filter is the filter BIQUAD shown in FIG. 1, while the slave filter can be regarded as a replica of one integrator portion of this filter BIQUAD, i.e. OTA3-C1 or OTA5-C2. It is further common practice to integrate the tuning system and the master filter on a same electronic chip to improve the tuning accuracy.

It is however to be noted that the frequency tuning system according to the present invention is not restricted to the above tuning of the transconductance of an OTA included in an integrator and of which the OTA included in the tuning system is a replica. Indeed, this tuning system is more generally applicable to tune the transconductance of any OTA to a desired value by choosing appropriate values for the capacitance of the reference capacitor and for the reference frequency. Furthermore, as will be clarified below, if the tuning system is used as a frequency tuning system as defined above, neither the OTA nor the reference capacitor have to be an exact replica of the respectively corresponding devices in the integrator to be tuned in the data processing path.

The filter shown in FIG. 1 is a biquadratic filter BIQUAD comprising 5 operational transconductance amplifiers OTA1, ..., OTA5 and 2 capacitors C1, C2. The filter BIQUAD has differential voltage input terminals VI to which like named signals VI are applied and produces a filtered differential output voltage VO across like named voltage output terminals VO. It has to be noted that all the intermediate signals in BIQUAD are balanced signals differentially applied on two corresponding terminals and that the constituent parts of BIQUAD operate on these differential signals. This will be implicitly understood throughout the following.

The voltage input terminals VI are connected to the inputs of an input transconductance amplifier OTA1 determining the passband gain G of the filter. Across the output terminals of OTA1 a first capacitor C1 is connected and the latter output terminals are further also connected to both the input terminals of a first damping operational transconductance amplifier OTA2 as well as to the voltage output terminals VO. The output terminals of OTA2 are connected both to the output terminals of OTA1, i.e. also to the voltage output terminals VO, and to the input terminals of a first filter operational transconductance amplifier OTA3. Across the output terminals of OTA3 a second capacitor C2 is connected and the latter output terminals are further connected to a second damping operational transconductance amplifier OTA4. The output terminals of OTA4 are connected both to the output terminals of OTA3 and to the input terminals of a second filter operational transconductance amplifier OTA5 whose output terminals are the output terminals VO of the filter BIQUAD.

By modifying their transconductance, OTA2 and OTA4 produce a controllable damping. This damping is tuned by a quality factor tuning voltage VTQ provided at a like named tuning terminal VTQ connected to both OTA2 and OTA4. The generation of the latter tuning voltage VTQ is the subject of the above mentioned co-pending patent application.

OTA3, OTA5, C1 and C2 perform the actual filtering and the transconductances of OTA3 and OTA5 are tuned by a frequency tuning voltage VTF provided at a like named tuning terminal VTF of BIQUAD and connected to OTA3, OTA5 and to OTA1. It is well known that the pairs OTA3-C1 and OTA5-C2 constitute integrators. The frequency tuning system is the subject of the present invention and tunes, via the above transconductances, the corresponding characteristic integrator frequencies to a desired value. The latter characteristic frequencies are nothing else than the ratio of the transconductances to the capacitance values of the associated capacitors. These characteristic frequencies together determine the above mentioned center frequency of the bandpass filter BIQUAD as explained below. As already mentioned, OTA1 is also controlled by the frequency tuning voltage VTF, the reasons therefore will be clarified later. It is to be noted that VTF and VTQ together tune the filter BIQUAD to have the above mentioned desired frequency response.

It is further to be noted that OTA1, ..., OTA5 each correspond to a same building block depicted in more detail in FIG. 2 and generally referenced to as an operational transconductance amplifier OTA. By using the operational transconductance amplifiers OTA2 and OTA4 to provide the controllable damping, two intrinsic advantages are procured for the BIQUAD. Firstly, integration on an electronic chip is easier as less distinct building blocks have to be designed, and secondly, achieving damping by means of active elements allows the introduction of energy via this damping technique, thereby counteracting the dissipation in the inevitable parasitic damping and hence also allowing a boosting of the quality factor above limitations set by this parasitic damping. The latter is equivalent to the inclusion of negative resistances which means that the transconductances are also made negative i.e. that OTA2 and OTA4 supply energy to BIQUAD. It is to be noted that a detailed description of OTA will be given below by making reference to FIG. 2.

In denoting the transconductance of OTA1, ..., OTA5 with gm1, ..., gm5 respectively, the operation of the filter BIQUAD will hereafter be described in detail. Firstly, in order to maximize the dynamic range, C1 and C2 are implemented as capacitors having an equal capacitance value C. In this way, all signals appearing in the filter BIQUAD will have similar amplitudes so avoiding that the dynamic range would be restricted by non-linear effects in a filter part with higher amplitude. Furthermore, the design of the filter BIQUAD is simpler when implementing OTA3 and OTA5 to have an equal transconductance, i.e. $gm3=gm5=gmr$ where gmr denotes an integrators transconductance since OTA3 and OTA5 can be seen as forming part of an integrator as mentioned higher. Similarly, OTA2 and OTA4 are implemented so as to have equal transconductances, i.e. $gm2=gm4=gmd$ where gmd denotes the damping transconductance. The latter equalities still hold in tuning the respective transconductances since OTA2 and OTA4 are both controlled via VTQ, while OTA3 and OTA5 are both controlled via VTF. It has further to be noted that in the following the word frequency will be indistinguishably used either to denote a frequency or to denote a corresponding pulsation to which the frequency is related via the constant 2Pi as generally known.

With the above considerations in mind it can be verified that the transfer function of the filter BIQUAD can be written in the Laplace domain as:

$$\frac{VO}{VI} = a(s+b) / \left( \frac{S^2}{WO^2} + \frac{Z}{WO}s + J \right) \quad (1)$$

In formula (1) the different coefficients a, b, WO, Z and J are related to the above defined parameters of BIQUAD in the following way:

$$a = \left( \frac{C}{gmr} \right)^2 \frac{gml}{C} \quad (2)$$

$$b = \frac{gmd}{C} \quad (3)$$

$$WO = \frac{gmr}{C} \quad (4)$$

$$Z = 2 \cdot \frac{gmd}{gmr} \quad (5)$$

$$J = \left( \frac{gmd}{gmr} \right)^2 - 1 \quad (6)$$

From well known theorems of analog filter theory the above coefficients can be interpreted as described hereafter. It is however first to be noted that the following formulas are only valid if the quality factor Q of BIQUAD is relatively large, e.g. larger than 10. The latter fact however is not a restriction upon the theories described hereafter and is only made for clarity's sake. It has further to be noted that in the following the word frequency will be indistinguishably used either to denote a frequency or to denote a corresponding pulsation to which the frequency is related via the constant 2Pi as generally known.

The characteristic frequency of the resonator consisting of OTA5, OTA5 and C1, C2 is WO and it can be verified that this WO is also the characteristic integrator frequency mentioned above to which/both pairs OTA3-C1 and OTA5-C2 should be tuned. This WO is further related to the center frequency of the bandpass filter BIQUAD through the following relation:

$$Wc = Sqrt(J) \cdot WO \quad (7)$$

wherein Sqrt denotes the square root operator.

From the above formula (7) it is clear that in tuning the quality factor and hence the controllable damping gmd to a desired value, as explained in detail in the above mentioned co-pending patent application, it remains for the frequency tuning system to tune gmr to a desired value in order to achieve a specific center frequency for BIQUAD. This can be practically achieved in tuning gmr so as to obtain a specific corresponding WO. Since WO is also the characteristic integrator frequency of both the OTA-C integrators OTA3-C1 and OTA5-C2, the tuning system acording to the present invention and described in detail later with reference to FIG. 3 will have to generate a frequency tuning signal VTF which tunes the transconductance gmr so that its ratio with C equals WO.

The further operation of BIQUAD is described in detail in the already mentioned co-pending patent application.

In summarizing it can be said that in tuning gmr with VTF to equal a calculated gmr, in tuning gml also with VTF, and finally in tuning gmd so that the passband gain G at the center frequency, say Wc, equals a desired gain value, the BIQUAD will have a desired calculated frequency reponse.

According to an inventive aspect of the present invention a linear and tunable OTA used in OTA1, . . . , OTA5 will now be described in detail with reference to FIG. 2. A large number of such OTA's are known from the literature and can all be used in conjunction with the present invention but the OTA described hereafter is particularly advantageous wherefore it will be used in the preferred embodiment of the present invention.

The linear and tunable bipolar OTA depicted in FIG. 2 has first and second differential voltage input terminals V1 and V2 on which like named voltages are applied respectively. OTA converts the latter voltages to first and second differential output currents I1 and I2 on like named current output terminals respectively. The latter conversion is characterized by the OTA's transconductance gm determining the differential output current to differential input voltage ratio. gm is tuned via a tuning input terminal VT on which a like named tuning input voltage is applied. VT might correspond to VTF as well as to VTQ according to the OTA's location the filter BIQUAD of FIG. 1.

OTA includes two parallel branches constituting an input stage coupled on the one hand to a first end of a resistor RDD whose second end is coupled to a power supply terminal VDD, and on the other hand to a ground terminal symbolically depicted in FIG. 2. A first branch consists of the series connection of a diode-connected npn transistor T3, an npn transistor T1 controlled via V1 and a symbolically represented current source producing a current I/2. Similarly, a second branch consists of a series connection of a diode-connected npn transistor T4, an npn transistor T2 controlled via V2 and a second symbolically represented current source also producing a current I/2. Each of the two mentioned current sources is coupled between the emitter electrode of T1/T2 and the ground terminal respectively. An emitter degeneration resistor R is further coupled between the emitter electrodes of T1 and T2.

The OTA further includes an output stage which is a bipolar differential pair consisting of three npn transistors T5, T6 and T7. T5 and T6 are the input transistors of this output stage and are controlled by the voltages appearing on the emitter electrodes of T3 and T4 respectively. The collector electrodes of T5 and T6 are connected to current output terminals I1 and I2 respectively, while their emitter electrodes are connected in common to the collector electrode of T7. T7 operates as a current source producing an amount of current controlled by the tuning voltage VT and its emitter electrode is connected to the ground terminal. The current produced by T7 and controlled via VT is indicated as I+D.

It can be easily verified that in a first approximation the overall transconductance gm of the OTA depicted in FIG. 2 can be expressed as:

$$gm = \frac{1}{R} \frac{I+D}{I} \quad (10)$$

where formula (10) is derived from the condition that the resistance of the resistor R is much larger than that of the resistances determined by transistors T1 and T2, i.e. larger than the reciprocal of their respective transconductances. The latter condition is in fact the condition that R strongly linearizes the input stage of OTA. Formula (10) can then further be interpreted as an input stage with a linearized gain equal to 1/R followed by an output stage, which is in fact similar to a known Gilbert gain cell, further amplifying the differential input signal with a factor (I+D)/I.

It is to be noted that diode-connected transistors T3 and T4 allow that the signal from the input stage is transferred to the output stage substantially without distortion as implicitly understood from formula (10). Indeed, it is well known in the art that the frequency dependent transconductance of T3 and T4 allows to cancel the frequency dependent transconductance of the input transistors T5 and T6 of the output stage of OTA respectively.

It is further clear that the transconductance gm of the OTA is in this way intrinsically inversely proportional to the resistance of R. Hence, when such OTA's are integrated on an electronic chip the various transconductances can be realized with great relative precision if they are tuned, with a same tuning voltage so that the factor (I+D)/I is substantially equal for all these various transconductances. Indeed, this relative precision is derived from the accuracy with which resistance ratios can be achieved on electronic chips.

This large relative precision is particularly useful in connection with the present invention as it allows an even greater freedom in choosing the parameters of the frequency tuning system. Indeed, in denoting the transconductance of an operational transconductance amplifier OTA included in the tuning system (described below) with gmt, the capacitance value of the reference capacitor with Ct and the reference frequency used in the tuning system with Wt, it is sufficient for tuning gmt to a desired value corresponding to a desired characteristic integrator frequency that the product of the reference frequency Wt with the capacitance value Ct equals the product of a proportionality constant with C and with the desired characteristic integrator frequency. The above proportionality constant, further denoted with "prop" stems from the fact that the OTA used in the tuning system is of the same type as the filter amplifiers OTA3/OTA5 which are tuned to gmr. As a consequence, the proportionality constant "prop" corresponds to the ratio of the degeneration resistance of the filter amplifier OTA3/OTA5 with the degeneration resistance of the OTA included in the tuning system depicted in FIG. 3.

The above equality can then be verified from the following relations which are valid if the amplifiers OTA, OTA3 and OTA5 are correctly tuned corresponding to a same tuning signal VTF as depicted in FIG. 1, $$WO = \frac{gmr}{C} \quad (8)$$

$$Wt = \frac{gmt}{Ct} \quad (9)$$

$$gmr = \frac{gmt}{prop} \quad (10)$$

The above three formulas can be easily rewritten as, $$Wt*Ct = WO*C*prop \quad (11)$$

which is nothing else than the equality described above in words. Formula (11) shows quite clearly that in using the above tuning scheme and considering NO and C as given, the parameters Wt, Ct and prop of the tuning system can be very freely chosen. The latter freedom can for instance be advantageously used in determining these parameters to achieve an optimal performance for the frequency tuning system or in sharing a same tuning system between various OTA's used in the data processing path of a same electronic chip and which are tuned to various transconductance values. Moreover, owing to the above relation between the parameters, a same signal generator means generating an input signal at the reference frequency as will be described later may be used both for the present frequency tuning system and for the quality factor tuning system of the above mentioned co-pending patent application. Indeed, although in the latter patent application a preferred embodiment of the quality factor tuning system uses a reference frequency which is equal to the center frequency Wc of the bandpass filter BIQUAD and may thus be different from the desired charateristic integrator frequency of an integrator in the master filter, the latter reference frequency of the quality factor tuning system may then however be used in the present frequency tuning system for tuning the latter integrator provided that the other parameters are modified so as to fullfill the above relation (11).

As already mentioned, FIG. 3 shows a frequency tuning system which includes a first operational transconductance amplifier OTA which is of the type shown in FIG. 2. This OTA is tuned with a frequency tuning signal VTF which is also applied to the two filter amplifiers OTA3 and OTA5 of the master filter BIQUAD (FIG. 1) included in the data processing path. In the present embodiment OTA is an exact replica of OTA3 and OTA5 and hence has a transconductance which is substantially identical to gmr.

It is to be noted that, as depicted in FIG. 1, VTF is further also applied to the input operational transconductance amplifier OTA1 of BIQUAD, The reasons therefore are clarified in the above mentioned co-pending patent application.

The tuning system of FIG. 3 inculdes the above signal generator means LO oscillating at a reference frequency Wt in the passband frequency range of BIQUAD. In this preferred embodiment, this reference frequency Wt is chosen to be the center frequency Wc of the bandpass filter BIQUAD. As a result LO can be shared with the above reference quality factor tuning system as mentioned earlier. LO has a balanced output voltage which is applied to the balanced input terminals of a first and a second tuning path. The first tuning path comprises the first amplifier OTA which has a voltage-to-current ratio or gain substantially equalling gmr, while the second tuning path comprises a second and balanced operational transconductance amplifier B-OTA. The latter second amplifier B-OTA has a fixed voltage-to-current ratio or gain determined by the product of the reference frequency Wt with Ct, Ct being the capacitance value of a capacitor Z connected as a degeneration impedance in B-OTA as will be shown in FIG. 4.

To be noted that from the above it is known that the proportionality constant "prop" substantially equals 1 and that, Wt substantially equals Wc as a result of which Ct can be calculated from formula (11).

The differential output currents of OTA and B-OTA are then converted to rectified single-ended currents IO1 and IO2 by current rectifiers. C-REC1 and C-REC2 respectively. IO1 and IO2 are the absolute values of the differential input currents of C-REC1 and C-REC2 respectively and they are applied to a common junction point to which the first end of a matching capacitor CM is also connected, the second end of CM being connected to the ground terminal. As clarified below, one of the rectified currents I01 and I02 always charges CM, while the other discharges CM.

The voltage appearing at the above-mentioned junction point is then low pass filtered via a low pass filter LP to produce the frequency tuning voltage VTF which is applied both to the first amplifier OTA and the master filter BIQUAD. C-REC1, C-REC2, CM and LP together form matching means MM, the voltage-to-current ratio or gain of the first and of the second tuning paths being compared by means of the matching capacitor CM.

What in fact is represented in FIG. 3 is a simple and sufficiently accurate way of comparing the gains of the two tuning paths.

By rectifying the currents of both tuning paths each of these paths either charges or discharges the matching capacitor CM. If the gain of the charging path is larger than the gain of the discharging path the voltage over CM will increase and vice versa. In order to achieve a negative feedback this voltage of CM (from which VTF is derived) should always reduce the difference in gain between the two tuning paths.

It can be verified that by including OTA in the discharging path such negative feedback is achieved. Indeed, if its gain exceeds the gain of B-OTA, the voltage over CM will decrease. Hence also, VTF will decrease and, as can be verified from the above description of OTA, the transconductance of OTA decreases.

The voltage across CM can however never be tuned to an ideal steady state DC value. Indeed, the 90 degrees of phase shift due to the capacitor Z in the second tuning path always results in IO1 and IO2 being out of phase. Hence, the difference between IO1 and IO2 can never be identically zero even when the amplitudes of I01 and I02 are equal. Such a characteristic for the voltage over CM is however sufficient to obtain a reliable transconductance value as the ripple on this voltage has, due to the rectification and the nature of C-REC1 and C-REC2 as described below, a high harmonic content. This ripple can then be easily filtered out by the low pass filter LP or one can even rely upon the parasitic low pass filtering of the lines over which the tuning signal VTF is transmitted towards BIQUAD and OTA. In any case, the simplicity of the matching means MM presents advantages exceeding the minor drawback of not accomplishing a very accurate steady state.

Building blocks C-REC and B-OTA of a current rectifier and a balanced operational transconductance amplifier respectively will non be described in detail with reference to FIG. 4. These building blocks are used in the tuning system of FIG. 5 as C-REC1, C-REC2 and B-OTA respectively.

The balanced operational transconductance amplifier B-OTA has differential voltage input terminals V11 and V12 on which like named voltages are applied. B-OTA converts these voltages V11 and V12 to first and second currents forming together balanced output currents. These first and second currents are then applied to first and second current input terminals of the current rectifier C-REC. According to an inventive aspect of the present invention, C-REC converts these currents to a single ended rectified current IO then available at a like named rectified current output terminal and which substantially equals the absolute value of the differential current present on its current input terminals. This rectified current IO has a predetermined sign, i.e. it is either always "leaving" C-REC or is always "entering" C-REC via the rectified current output terminal IO. However, in accordance with another inventive aspect of the current rectifier C-REC, this sign is determined by a small portion of C-REC and the latter rectifier is thus well suited to provide either the charging or the discharging current needed in the quality factor tuning system described above by implementing it with a corresponding interconnection pattern as clarified below.

B-OTA includes two bipolar input transistors T11 and T12 controlled by the input voltages V11 and V12 respectively. The emitter electrode of T11/T12 is connected to a first end of a current source I11/I12 whose second end is connected to the ground terminal. Between these emitter electrodes an emitter degeneration impedance Z, which is the above mentioned reference capacitor with capacitance value Ct, is coupled for determining the transconductance and hence also the gain of the B-OTA in the same way as the transconductance of the input stage of the aforedescribed OTA depicted in FIG. 2 was determined by the emitter degeneration resistance R. The collector electrodes of T11 and T12 constitute the above mentioned first and second current input terminals of the current rectifier C-REC respectively.

From the above it follows that ideally the transconductance of B-OTA is given by the conductance or voltage-to-current gain of the reference capacitor Z having the capacitance Ct at the reference frequency Wt. The latter conductance is clearly nothing else than the product of Ct with Wt as required for the above tuning system. It is to be noted that, for holding the above equality between the transconductance of B-OTA and the conductance of Z, it is necessary that the resistance value of Z at Wt is much larger than the reciprocal of the transconductances of the input transistors T11 and T12 of B-OTA as it is well known in the art. However, from formula (11) it follows that a large freedom exists in choosing Ct and Wt so that the above condition is easily met.

C-REC includes first and second parallel branches coupled between a power supply terminal VDD and the mentioned first and second current input terminals respectively. The first branch includes the series connection of a first load resistor RDD1 and a diode-connected pnp transistor T17, the second branch includes the series connection of a second load resistor RDD2 and a pnp transistor T18, the base electrode of which is connected to the commoned base and collector electrodes of T17. The collector electrodes of T17 and T18 are coupled to both the first and the second current input terminal via first and second switching paths consisting of npn transistors T15/TI6-T17-T18 and T13/T14 respectively. These first and second switching paths include respectively first T15, T16 and second T14, T13 switching means which in turn each include first T15/T14 and second T16/T13 switches, the latter switches being the four last mentioned npn transistors. The first T15 and the second T16 switch of the first switching means connect the first and the second current input terminal to the collector electrode of T17 respectively, while the first T14 and the second T13 switch of the second switching means connect the first and the second current input terminal to the collector electrode of T18 respectively. As a result, the collector electrode of T18 operates as a rectifying node and corresponds to the current output terminal IO of C-REC.

C-REC further includes a differential amplifier arrangement consisting of npn transistors T19 and T20, load resistors RDD3 and RDD4 and current source I13. The base electrodes of T19 and T20, which are respectively the first and second input terminals of this amplifier arrangement, are controlled from the first and second current input terminals of C-REC respectively.

Figure 4:
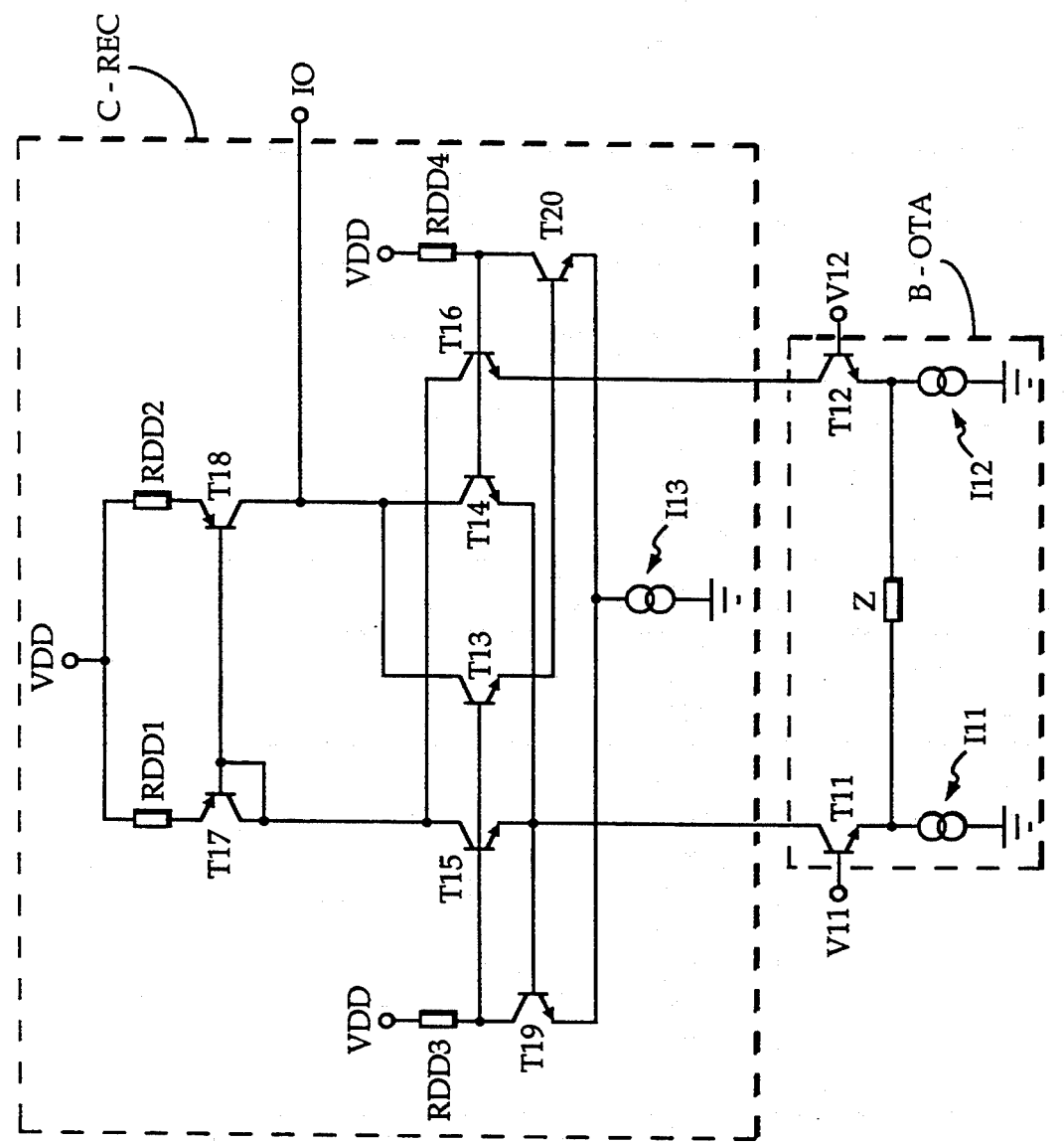
FIG. 4 shows in more detail a balanced operational transconductance amplifier B-OTA and a current rectifier C-REC used in the tuning system of FIG. 3.

From FIG. 4 it is clear that the first switching path towards the rectifying node IO is created via the main emitter-to-collector path of T15 or T16 and the current mirror circuit constituted by T17 and T18 and that a second switching path towards IO is also created via the main path of T13 or T14. It is further clear that both these switching paths can be taken by both the above two balanced currents.

B-OTA has a fixed voltage-to-current ratio or gain determined by the reference capacitor whereby it provides the first and second currents corresponding to the gain needed in the above described tuning system.

These currents cause a voltage drop at the inputs of C-REC and the resulting voltages at the current input terminals of C-REC are amplified by the differential amplifier arrangement T19, T20, RDD3, RDD4 and I13. It can be verified that if the first current, i.e. the current at the first input terminal of C-REC, is the largest and the gain of the amplifier arrangement is large enough, switches T15 and T13 will be closed, whilst switches T14 and T16 are open. The first and largest current will then reach the rectifying node IO via the mentioned first switching path, while the second and smallest current reaches IO via the second switching path. The subtraction of these two currents at IO then yields the differential current in the outgoing direction. Similarly, when the second current, i.e. the current at the second input terminal of C-REC, is the largest, it can be verified that it reaches IO via the first switching path through T16, while the first and smallest current reaches IO through T14. From the above it is clear that on the current output terminal IO the rectified differential current is present in the outgoing direction. It can be further easily verified that in including the current mirror circuit T17, T18 in the second instead of in the first swithing path, the same rectified current will be provided at IO in the incoming direction. The latter fact allows to similarly design both the discharging rectifier C-REC1 and the charging rectifier C-REC2 depicted in FIG. 3. The above active rectifier C-REC moreover uses very little hardware due to the fact that the rectification and the conversion to a single ended current are performed simultaneously.

It is finally to be noted that due to the non-ideal behaviour of the switches and of the amplifier arrangement the rectified current produced by C-REC will deviate somewhat from the exact rectified current. However, it can be proved that this effect only pushes the ripple on the tuning voltage VTF to a higher frequency band without having any negative effect on the above gain comparison. As a consequence, this effect rather constitutes an advantage than a disadvantage in the tuning system according to the present invention.

While the principles of the invention have been described above in connection with specific apparatus, it is to be clearly understood that this description is made only by way of example and not as a limitation on the scope of the invention. Moreover, although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. A tuning system for providing a tuning signal (VTF) for tuning a center frequency of a bandpass analog filter, said tuning system comprising:

a first operational transconductance amplifier (OTA, C-REC1) responsive to said tuning signal (VTF), and to a reference frequency (Wt) signal, for providing a first output signal (IO1) indicative of a first transconductance parameter (gmr) of said first operational transconductance amplifier tuned to a reference transconductance value by said tuning signal (VTF);

a reference signal means (B-OTA, C-REC2), also responsive to said reference frequency (Wt) signal, for providing a second output signal (IO2) indicative of said reference transconductance value, said reference signal means having a reference capacitor (Z) having a reference capacitance value (Ct) for providing said second output signal (IO2) indicative of a second transconductance parameter (gmt) of said reference signal means having said reference transconductable value, said reference transconductance value being proportional, with a first proportionality factor, to the product of said reference capacitance value (Ct) and said reference frequency (Wt); and comparing means (CM) coupled to the first operational transconductance amplifier and to the reference signal means, responsive to the first and second output signals (IO1, IO2), for providing a third output signal which is a function of the difference of the first and second output signals (IO1, IO2) from which the tuning signal (VTF) is derived, said tuning signal for being provided as a negative feedback input (VTF) to the first operational transconductance amplifier (OTA, C-REC1).

2. The tuning system according to claim 1, further comprising a reference frequency source (LO) for providing said reference frequency (Wt) signal.

3. The tuning system according to claim 2, wherein said second output signal (IO2) is indicative of a voltage-to-current ratio of the reference capacitor (Z) at said reference frequency and wherein the reference signal means (B-OTA, C-REC2) includes a second operational transconductance amplifier (B-OTA) and wherein the reference capacitor (Z) comprises a degeneration impedance having a transconductance equal to said voltage-to-current ratio.

4. The tuning system according to claim 1, wherein the reference signal means (B-OTA, C-REC2) and the first operational transconductance amplifier (OTA, C-REC1) each perform a voltage-to-current conversion, and wherein the second output signal (IO2) and the first output signal (IO1) are current signals provided to the comparator means (CM) comprising a common matching capacitor via respective second (C-REC2) and first (C-REC1) rectifier means for converting the second output signal (IO2) and the first output signal (IO1) to single-ended rectified second and first current signals, respectively, and for providing the second and first current signals to the common matching capacitor to charge and discharge the matching capacitor, respectively.

5. The tuning system according to claim 4, wherein said bandpass filter includes a third operational transconductance amplifier (OTA3/OTA5), said third operational transconductance amplifier responsive to the tuning signal (VTF), said third operational transconductance amplifier connected to an integrator capacitor (C1/C2) having an integrator capacitance value (c) and forming with the third operational transconductance amplifier an integrator (OTA3-C1/OTA5-C2), wherein a transconductance of the third opertional transconductance amplifier (OTA3/OTA5) is proportional to the transconductance value of the first transconductance parameter (gmr), and wherein a product of an operational frequency (WO) of the integrator and the integrator capacitance value (C) is proportional, with a second proportionality factor, to a product of the reference capacitance value (Ct) and the reference frequency (Wt), the first and second proportionality factors being substantially equal.

6. The tuning system according to claim 5, wherein the first operational transconductance amplifier (OTA, C-REC1) and the third operational transconductance amplifier (OTA3/OTA5) have included therein a first and a second degeneration resistance (R), respectively, a ratio of the first and second degeneration resistances being equal to the second proportionality factor.

7. The tuning system according to claim 5, wherein the first and third operational transconductance amplifiers have a same degeneration resistance (R), and wherein the second proportionality factor is equal to one.

8. tuning system according to claim 5, wherein the integrator forms part of said bandpass analog filter (BIQUAD) with a center frequency equal to the selected reference frequency.

* * * * *

UNITED STATES PATENT AND TRADEMARK OFFICE
CERTIFICATE OF CORRECTION

PATENT NO. : 5,440,264
DATED : August 8, 1995
INVENTOR(S) : Sevenhans et al

It is certified that error appears in the above-indentified patent and that said Letters Patent is hereby corrected as shown below:

At column 18, line 16 (claim 8, line 1), prior to "tuning", please insert --The--.

Signed and Sealed this

Fourteenth Day of November, 1995

*Attest:*

BRUCE LEHMAN

*Attesting Officer*   *Commissioner of Patents and Trademarks*